(12) United States Patent
Zheng et al.

(10) Patent No.: US 11,719,777 B2
(45) Date of Patent: Aug. 8, 2023

(54) FLEXIBLE RADIO FREQUENCY RECEIVING COIL ARRAY

(71) Applicant: SHENZHEN INSTITUTES OF ADVANCED INTEGRATION TECHNOLOGY CHINESE ACADEMY OF SCIENCES, Shenzhen (CN)

(72) Inventors: Hairong Zheng, Shenzhen (CN); Ye Li, Shenzhen (CN); Qiaoyan Chen, Shenzhen (CN); Chao Luo, Shenzhen (CN); Jo Lee, Shenzhen (CN); Shi Su, Shenzhen (CN); Xin Liu, Shenzhen (CN)

(73) Assignee: Shenzhen Institutes of Advanced Technology Chinese Academy of Sciences, Shenzhen (CN)

( * ) Notice: Subject to any disclaimer, the term of this patent is extended or adjusted under 35 U.S.C. 154(b) by 328 days.

(21) Appl. No.: 17/272,677

(22) PCT Filed: Apr. 28, 2018

(86) PCT No.: PCT/CN2018/085121
§ 371 (c)(1),
(2) Date: Mar. 2, 2021

(87) PCT Pub. No.: WO2019/205151
PCT Pub. Date: Oct. 31, 2019

(65) Prior Publication Data
US 2022/0349966 A1 Nov. 3, 2022

(51) Int. Cl.
G01R 33/36 (2006.01)
G01R 33/34 (2006.01)

(52) U.S. Cl.
CPC ......... *G01R 33/3621* (2013.01); *G01R 33/34* (2013.01)

(58) Field of Classification Search
CPC ..... G01R 33/3621; G01R 33/34; G01R 33/36
See application file for complete search history.

(56) References Cited

FOREIGN PATENT DOCUMENTS

| CN | 101029921 A | 9/2007 |
|----|-------------|--------|
| CN | 101292173 A | 10/2008 |

(Continued)

OTHER PUBLICATIONS

Machine translation of cited foreign reference Biber (CN-102288930-A) (Year: 2011).*

*Primary Examiner* — G. M. A Hyder
(74) *Attorney, Agent, or Firm* — Robert L. Stearns; Dickinson Wright PLLC

(57) ABSTRACT

A flexible radiofrequency receiving coil array. The flexible radiofrequency receiving coil array is provided on a flexible panel and comprises several rows of coil units. Adjacent two rows of coil units in the several rows of coil units are alternately arranged. Preamplifiers are provided in the coil units. In the flexible radiofrequency receiving coil array, two preamplifiers in adjacent two coil units are provided on a same preamplifier mounting plate on the flexible panel, where multiple preamplifier mounting plates are provided on the flexible panel, and the preamplifier mounting plates of different columns and rows are linearly arranged. The flexible radiofrequency receiving coil array effectively reduces the distribution density of the preamplifiers, ensures the flexibility and maximum degree of distension of the coil array, and improves the fit of the coil array to the human body, thus increasing image signal-to-noise ration and image quality.

17 Claims, 3 Drawing Sheets

(56) References Cited

FOREIGN PATENT DOCUMENTS

| CN | 102288930 | A | * | 12/2011 | ......... G01R 33/3415 |
|----|-----------|---|---|---------|------------------------|
| CN | 102288930 | A |   | 12/2011 |                        |
| CN | 103257331 | A |   | 8/2013  |                        |
| CN | 204575834 | U |   | 8/2015  |                        |
| CN | 107728087 | A |   | 2/2018  |                        |

* cited by examiner

FLEXIBLE RADIO FREQUENCY RECEIVING COIL ARRAY

CROSS-REFERENCE TO RELATED APPLICATION

The present application is a 35 U.S.C. § 371 national stage application of PCT Application Ser. No. PCT/CN2018/085121, filed on Apr. 28, 2018, the entire content of which is incorporated herein by reference in its entirety.

BACKGROUND

Technical Field

The present application relates to the technical field of medical devices, in particular, to a flexible radio frequency receiving coil array.

Description of Related Art

Magnetic resonance imaging technology has the advantages of non-invasive, non-radiation, multi-parameter, high resolution, high contrast, and arbitrary azimuth cross-sectional imaging and has become an important inspection tool for fetal anatomy and pathological changes. However, due to the mobility of the fetus or the involuntary movement of the pregnant woman, the scanned image will produce motion artifacts. In order to reduce motion artifacts, imaging scans need to be completed in a short time.

At present, in the magnetic resonance system, the realization of rapid imaging needs to rely on phased array coil technology. Generally speaking, the more the number of coil units, the stronger the parallel acceleration capability of the system, that is, the less the loss of image signal-to-noise ratio under the condition of high acceleration factor, but with the increase in the number of coil units and the increase in distribution density, the number and distribution density of preamplifiers also increase, which will reduce the flexibility and bending degree of the coil, and cannot fit the human body, resulting in that the image signal-to-noise ratio and image quality decrease.

SUMMARY

The main purpose of the embodiment of the present application is to provide a flexible radio frequency receiving coil, which can solve the technical problems of low image signal-to-noise ratio and low image quality of the magnetic resonance imaging technology in the prior art.

To achieve the above objective, the embodiment of the present application provides a flexible radio frequency receiving coil array, the flexible radio frequency receiving coil array is arranged on a flexible panel, and the flexible radio frequency receiving coil array comprises a plurality of rows of coil units, two adjacent rows of coil units among the plurality of rows of coil units are arranged in a staggered manner;

preamplifiers are arranged inside the coil units, and two preamplifiers of two adjacent coil units in the flexible radio frequency receiving coil array are arranged on the same preamplifier installation plate on the flexible panel, wherein the flexible panel is arranged with a plurality of preamplifiers installation plates, and each row and each column of preamplifier installation plates are arranged along straight lines, respectively.

Optionally, a size of a coil unit at a head of each odd row and a size of a coil unit at an end of each even row in the flexible radio frequency receiving coil array are both smaller than a size of each of the remaining coil units, and the coil units of the odd rows are aligned with the coil units of the even rows at two ends.

Optionally, a copper circuit is arranged in the coil units, the copper circuit in the coil units at the head of the odd rows includes a first preset number of fixed capacitors, and the copper circuit in the coil units at the end of the even rows includes a second preset number of fixed capacitors, the first preset number is less than the second preset number.

Optionally, the first preset number is four, and the second preset number is six.

Optionally, the coil units include: a passive detuning circuit, a tuning circuit, an active detuning circuit, a matching circuit, a radio frequency trap circuit, a radio frequency choke coil, a radio frequency coaxial cable, and a decoupling circuit;

the passive detuning circuit, the tuning circuit, the active detuning circuit and the matching circuit are arranged in a copper circuit of the coil units;

the radio frequency trap circuit is connected to the active detuning circuit, the radio frequency choke coil is connected to the radio frequency trap circuit in series, one end of the radio frequency coaxial cable is connected to the matching circuit, and the other end is connected to the decoupling circuit, and the decoupling circuit is connected to preamplifiers in the coil units.

Optionally, the passive detuning circuit includes a first capacitor, a first inductor, a first diode, and a second diode, the first capacitor is arranged in the copper circuit of the coil units, and the first diode and the second diode are connected in parallel with opposite polarities, the first inductor is connected to the first diode and the second diode in series, and the first capacitor is connected to the first inductor, the first diode and the second diode in parallel;

the tuning circuit includes a second capacitor and a first variable capacitor, the second capacitor is arranged in a copper circuit of the coil units, and the second capacitor is connected to the first variable capacitor in parallel;

the active detuning circuit includes a third capacitor, a second inductor, and a third diode, the third capacitor is arranged in a copper circuit of the coil units, and the second inductor is connected to the third diode in series, the third capacitor is connected to the second inductor and the third diode in parallel;

the matching circuit includes a fourth capacitor and a second variable capacitor, the fourth capacitor is arranged in a copper circuit of the coil units, and the fourth capacitor is connected to the second variable capacitor in parallel;

the radio frequency trap circuit includes a fifth capacitor and a third inductor, and the fifth capacitor is connected to the third inductor in parallel;

the decoupling circuit includes a sixth capacitor and a third variable capacitor, and the sixth capacitor is connected to the third variable capacitor in parallel.

Optionally, the flexible panel includes a flexible circuit board and a flexible installation board, the copper circuit of the coil units is printed on the flexible circuit board, and the preamplifiers installation plate is arranged on the flexible installation board.

Optionally, a plurality of through holes are arranged on the flexible panel, and the through holes are rectangular or circular.

Optionally, the flexible circuit board is made of polyimide film or polyester film, and the flexible installation board is made of polyethylene foam.

The flexible radio frequency receiving coil array provided by the embodiment of the present application is arranged on the flexible panel, and includes a plurality of rows of coil units. Among a plurality of rows of coil units, two adjacent rows of coil units are arranged in a staggered manner. The preamplifiers are arranged inside the coil units, the two preamplifiers of the two adjacent coil units in the flexible radio frequency receiving coil array are arranged on the same preamplifiers installation plate on the flexible panel, a plurality of preamplifiers installation plates are arranged on the flexible panel, and each row and each column of the preamplifiers installation plate are arranged along a straight line. Compared with the prior art, the arrangement provided by the embodiment of the present application that two preamplifiers in two adjacent coil units on the same preamplifiers installation plate of the flexible panel, and each row and each column of the preamplifiers installation plate on the flexible panel are arranged along a straight line can effectively reduce the distribution density of the preamplifiers, ensure the flexibility and maximum bending degree of the coil array, so that the coil array can better fit the human body, thereby improving the image signal-to-noise ratio and image quality.

BRIEF DESCRIPTION OF THE DRAWINGS

In order to more clearly illustrate the embodiment of the present application or the technical solution in the prior art, the following will briefly introduce the drawings that need to be used in the description of the embodiment or the prior art. Obviously, the drawings in the following description are only some embodiments of the present application. For those skilled in the art, other drawings can be obtained based on these drawings without creative work.

DETAILED DESCRIPTION

In order to make the purpose, features, and advantages of the present application more obvious and understandable, the following will combine the drawings in the embodiment of the present application to clearly and completely describe the technical solutions in the embodiment of the present application. Obviously, the described embodiments are only a part of the present application, not all the embodiments. Based on the embodiments in the present application, all other embodiments obtained by those skilled in the art without creative work fall within the protection scope of the present application.

Figure 1:
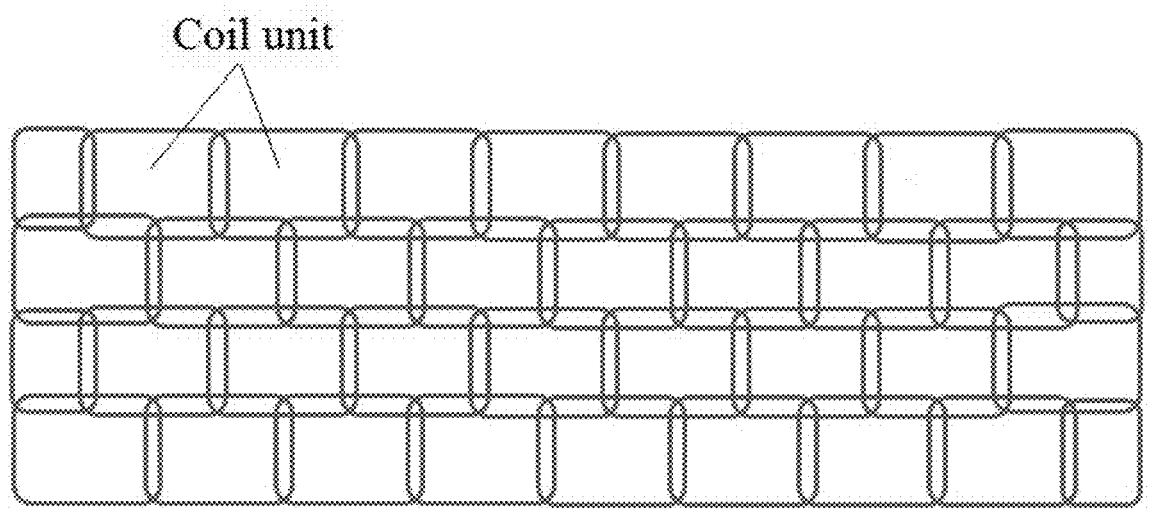
FIG. 1 is a schematic diagram of a flexible radio frequency receiving coil array in the embodiment of the present application.

The embodiment of the present application provides a flexible radio frequency receiving coil array. The flexible radio frequency receiving coil array is arranged on a flexible panel and includes a plurality of rows of coil units. Among a plurality of rows of coil units, two adjacent rows of coil units are arranged in a staggered manner. Referring to FIG. 1, which is a schematic diagram of a flexible radio frequency receiving coil array in the embodiment of the present application.

In FIG. 1, the flexible radio frequency receiving coil array includes 4 rows of coil units. In order to align the odd rows coil units with the two ends of the even rows coil units, the size of the coil units at the head of the odd rows and the coil units at the end of the even rows in the flexible radio frequency receiving coil array is smaller than the size of the remaining coil units.

In this embodiment, the size of the coil units at the head of the odd rows and the coil units at the end of the even rows is optionally 98 mm*56.5 mm; the size of other remaining coil units is optionally 110 mm*103 mm.

Preamplifiers are arranged inside the above-mentioned coil units, and the two preamplifiers of the two adjacent coil units in the above-mentioned flexible radio frequency receiving coil array are arranged on the same preamplifiers installation plate of the above-mentioned flexible panel, the above-mentioned flexible panel is arranged with a plurality of preamplifiers installation plates, and each row and each column of preamplifiers installation plate are arranged along a straight line. Specifically, two preamplifiers in two adjacent coil units in the same row of coil units can be arranged on the same preamplifiers installation plate, or two preamplifiers in two adjacent coil units in two adjacent rows can be arranged on the same preamplifiers installation plate.

Figure 2:
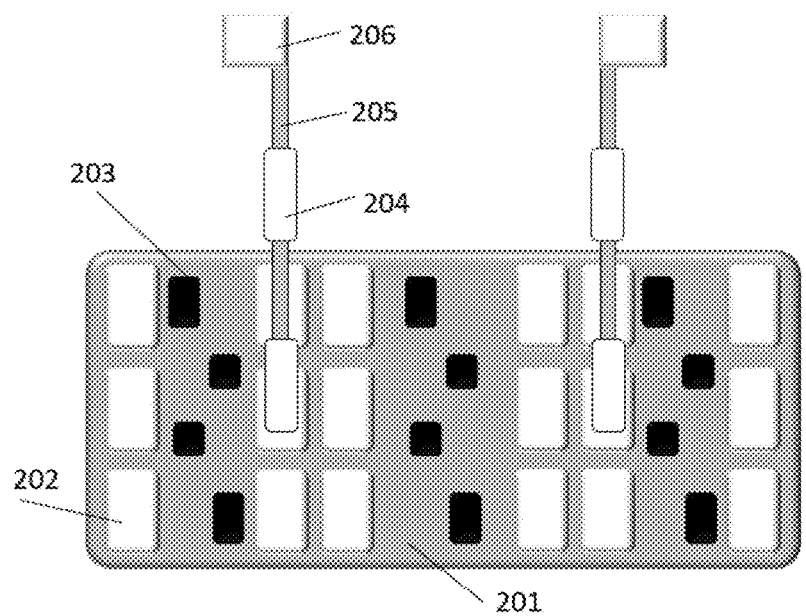
FIG. 2 is a schematic diagram of a flexible panel in the embodiment of the present application.

In order to better understand the embodiment of the present application, refer to FIG. 2. FIG. 2 is a schematic diagram of the flexible panel in the embodiment of the present application. In FIG. 2, the flexible panel includes a flexible housing 201, a plurality of preamplifiers installation plates 202, a plurality of through holes 203, a balun circuit 204, a radio frequency coaxial cable 205 and a coil plug 206.

The through hole 203 is a rectangular through hole or a circular through hole, which is mainly used to reduce the weight of the above-mentioned flexible panel and to save materials. The balun circuit 204 is mainly used to control the current flowing into the outside of the shielding layer of the radio frequency coaxial cable 205. In addition, in order to ensure the flexibility and greater degree of bending of the flexible radio frequency receiving coil array, the two outer preamplifiers installation plates of the flexible panel should be arranged as close as possible to the edge of the flexible panel, and the distance from the edge of the flexible panel is less than 3 cm. The rest preamplifiers installation plates formed a group of two columns, are evenly distributed on the flexible panel, and the two preamplifiers installation plates in each group are as close as possible, and the distance between the two preamplifiers installation plates is less than 2 cm.

Furthermore, a copper circuit is arranged in the aforementioned coil units, the copper circuit in the coil units at the head of the odd rows includes a first preset number of fixed capacitors, and the copper circuit in the coil units at the end of the even rows includes a second preset number of fixed capacitors, the above first preset number is smaller than the second preset number. In this embodiment, the above-mentioned first preset number is optionally 4, and the above-mentioned second preset number is optionally 6.

The width of the aforementioned copper circuit is optionally 6 mm, and the thickness is optionally 1 oz (0.035 mm).

Furthermore, the flexible panel includes a flexible circuit board and a flexible installation board, the copper circuit of the coil units is printed on the flexible circuit board, and the preamplifiers installation plate is arranged on the flexible installation board. Specifically, the above-mentioned flexible installation board is divided into two layers, the thickness can be selected as 10 mm, and the above-mentioned flexible circuit board is arranged in the middle. The above-mentioned flexible circuit board can be made of polyimide film or polyester film, and the above-mentioned flexible installation board can be made of polyethylene foam. It can be understood that the above-mentioned flexible circuit board and flexible installation board may also be made of other flexible materials.

Figure 3A:
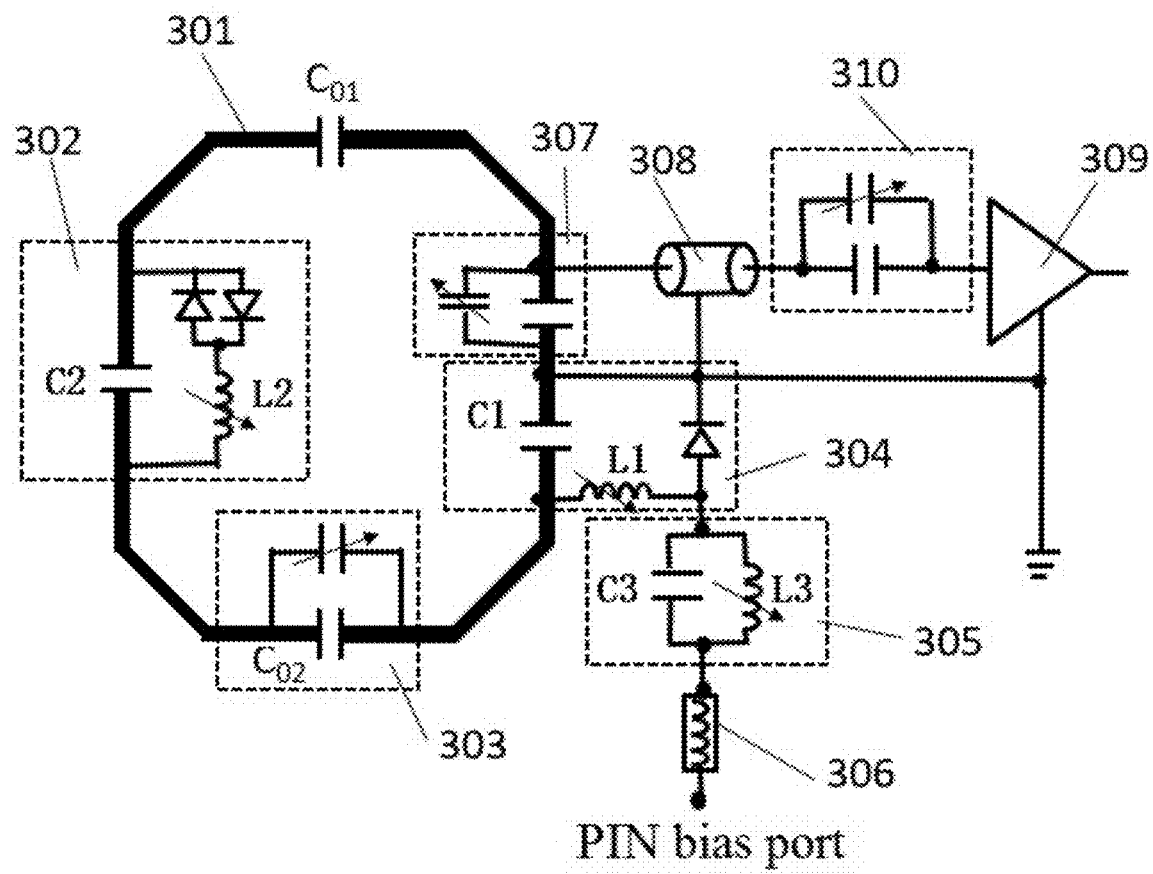
FIG. 3a is a schematic diagram of the circuit of coil units in the embodiment of the present application.

Furthermore, referring to FIG. 3a, FIG. 3a is a schematic diagram of the circuit of the coil units in the embodiment of the present application. In this embodiment, the above-mentioned coil units include: a copper circuit 301, a passive detuning circuit 302, a tuning circuit 303, an active detuning circuit 304, a radio frequency trap circuit 305, a radio frequency choke coil 306, a matching circuit 307, a radio frequency coaxial cable 308, a preamplifiers 309 and a decoupling circuit 310;

Among them, the passive detuning circuit 302, the tuning circuit 303, the active detuning circuit 304 and the matching circuit 307 are arranged in copper circuit 301 in coil units; the radio frequency trap circuit 305 is connected to the active detuning circuit 304, the radio frequency choke coil 306 is connected to radio frequency trap circuit 305 in series, and one end of the radio frequency coaxial cable is connected to matching circuit 307, the other end of the radio frequency coaxial cable is connected to the decoupling circuit 310, and the decoupling circuit 310 is connected to preamplifiers 309 in coil units.

Specifically, the passive detuning circuit 302 includes a first capacitor C2, a first inductor L2, a first diode, and a second diode. The first capacitor C2 is arranged in the copper circuit 301 of the coil units. The first diode and the second diode are connected in parallel with opposite polarities. The first inductor L2 is connected to the first diode and the second diode in series, the first capacitor C2 is connected to the first inductor L2, the first diode and the second diode in parallel.

The tuning circuit 303 includes a second capacitor and a first variable capacitor. The second capacitor is arranged in the copper circuit 301 of coil units. The second capacitor is connected to the first variable capacitor in parallel.

The active detuning circuit 304 includes a third capacitor C1, a second inductor L1, and a third diode. The third capacitor C1 is arranged in the copper circuit 301 of the coil units, the second inductor L1 is connected to the third diode in series, and the third capacitor C1 is connected to the second inductor L1 and the aforementioned third diode in parallel.

The matching circuit 307 includes a fourth capacitor and a second variable capacitor. The fourth capacitor is arranged in the copper circuit 301 of the above-mentioned coil units, and the fourth capacitor is connected to the above-mentioned second variable capacitor in parallel.

The radio frequency trap circuit 305 includes a fifth capacitor C3 and a third inductor L3, and the fifth capacitor C3 is connected to the third inductor L3 in parallel.

The decoupling circuit 310 includes a sixth capacitor and a third variable capacitor, and the sixth capacitor is connected to the third variable capacitor in parallel.

The calculation formula of capacitance Ci and inductance Li is: $f=1/(2\pi\sqrt{L_iC_i})$, where i=1, 2, f is the working resonant frequency of coil units, C3=1 nF, L3=2.7 µH. The capacitance or inductance that is not marked in the above-mentioned coil units can be obtained through experiments. The functions of the above-mentioned passive detuning circuit 302 and active detuning circuit 304 are: when the radio frequency pulse excites the sample, the receiving coil does not work; when the radio frequency pulse stops exciting, the receiving coil starts to receive the magnetic resonance signal. The radio frequency trap circuit 305 and radio frequency choke coil 306 added at the bias port of the PIN diode are used to prevent interference from a long power supply line to reduce the loss of magnetic resonance signals and noise, and to improve the image signal-to-noise ratio.

The coil units shown in FIG. 3a are the coil units at the head of the odd rows and the coil units at the end of the even rows in the flexible radio frequency receiving coil array, and the copper circuit includes four fixed capacitors C1, C2, $C_{01}$, and $C_{02}$.

Figure 3B:
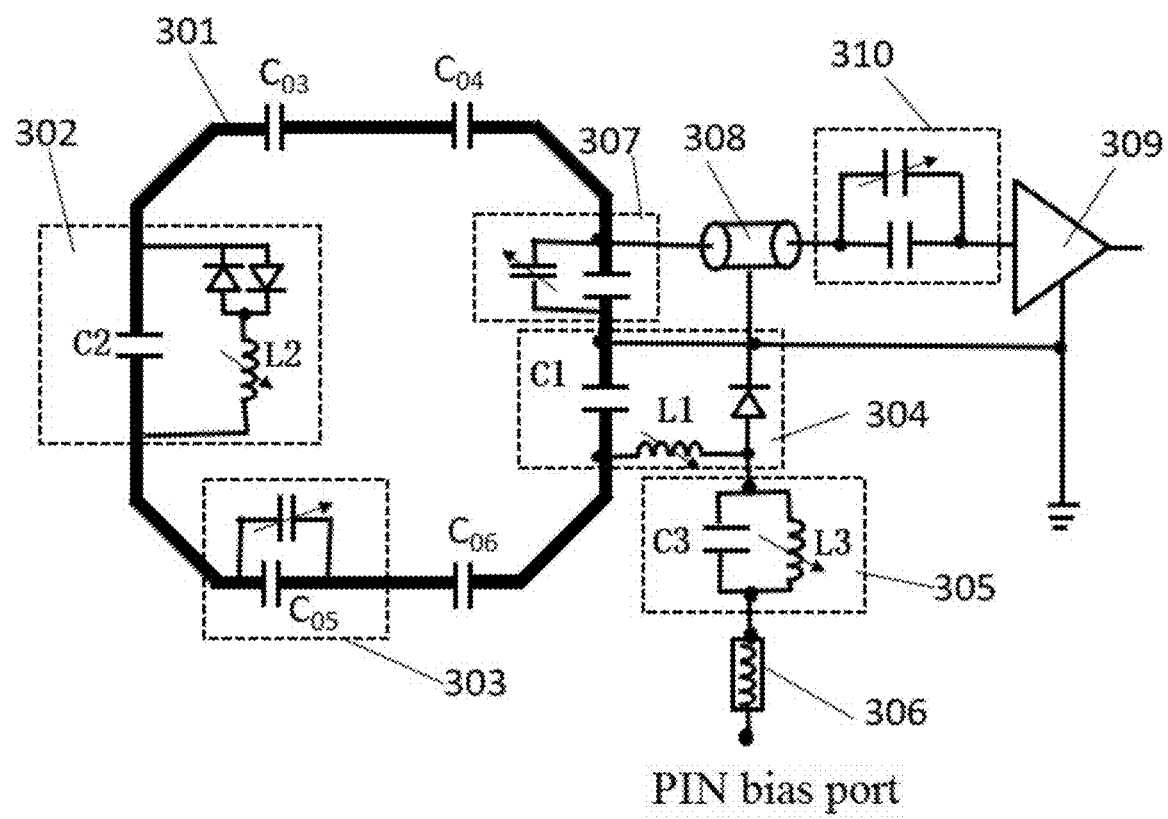
FIG. 3b is a schematic diagram of another circuit of coil units in the embodiment of the present application.

Referring to FIG. 3b, FIG. 3b is a schematic diagram of another circuit of the coil units in the embodiment of the present application. The coil units shown in FIG. 3b are the remaining coil units except the coil units at the head of the odd rows and the coil units at the end of the even rows in the flexible radio frequency receiving coil array. The copper circuit includes six fixed capacitors: C1, C2, $C_{03}$, $C_{04}$, $C_{05}$ and $C_{06}$.

The values of the fixed capacitors $C_{01}$, $C_{02}$, $C_{03}$, $C_{04}$, $C_{05}$, and $C_{06}$ can be obtained through experiments.

The flexible radio frequency receiving coil array provided by the embodiment of the present application is arranged on the flexible panel, and includes a plurality of rows of coil units. Among a plurality of rows of coil units, two adjacent rows of coil units are arranged in a staggered manner. The preamplifiers are arranged inside the coil units, the two preamplifiers of the two adjacent coil units in the flexible radio frequency receiving coil array are arranged on the same preamplifiers installation plate on the flexible panel, where a plurality of preamplifiers installation plates are arranged on the flexible panel, and each row and each column of the preamplifiers installation plate are arranged along a straight line. Compared with the prior art, the arrangement provided by the embodiment of the present application that two preamplifiers in two adjacent coil units on the same preamplifiers installation plate of the flexible panel, and each row and each column of the preamplifiers installation plate on the flexible panel are arranged along a straight line can effectively reduce the distribution density of the preamplifiers, ensure the flexibility and maximum bending degree of the coil array, so that the coil array can better fit the human body, thereby improving the image signal-to-noise ratio and image quality.

The above is a description of a flexible radio frequency receiving coil array provided by the present application. For those skilled in the art, according to the idea of the embodiment of the present application, there will be changes in the specific implementation and the scope of application. In summary, the content of this application text should not be construed as a restriction on the present application.

What is claimed is:

1. A flexible radio frequency receiving coil array, wherein the flexible radio frequency receiving coil array is arranged on a flexible panel, and the flexible radio frequency receiving coil array comprises a plurality of rows of coil units, two adjacent rows of coil units among the plurality of rows of coil units are arranged in a staggered manner;

preamplifiers are arranged inside the coil units, and two preamplifiers of two adjacent coil units in the flexible radio frequency receiving coil array are arranged on the same preamplifier installation plate on the flexible panel, wherein the flexible panel is arranged with a plurality of preamplifiers installation plates, and each row and each column of preamplifier installation plates are arranged along straight lines, respectively, wherein a size of a coil unit at a head of each odd row and a size of a coil unit at an end of each even row in the flexible radio frequency receiving coil array are both smaller than a size of each of the remaining coil units, and the coil units of the odd rows are aligned with the coil units of the even rows at two ends.

2. The flexible radio frequency receiving coil array of claim 1, wherein a copper circuit is arranged in the coil units, the copper circuit in the coil units at the head of the odd rows comprises a first preset number of fixed capacitors, and the copper circuit in the coil units at the end of the even rows comprises a second preset number of fixed capacitors, the first preset number is less than the second preset number.

3. The flexible radio frequency receiving coil array of claim 2, wherein the first preset number is four, and the second preset number is six.

4. The flexible radio frequency receiving coil array of claim 3, wherein the flexible panel comprises a flexible circuit board and a flexible installation board, the copper circuit of the coil units is printed on the flexible circuit board, and the preamplifiers installation plate is arranged on the flexible installation board.

5. The flexible radio frequency receiving coil array of claim 4, wherein a plurality of through holes are arranged on the flexible panel, and the through holes are rectangular or circular.

6. The flexible radio frequency receiving coil array of claim 4, wherein the flexible circuit board is made of a polyimide film or a polyester film, and the flexible installation board is made of a polyethylene foam.

7. The flexible radio frequency receiving coil array of claim 2, wherein the coil units comprise: a passive detuning circuit, a tuning circuit, an active detuning circuit, a matching circuit, a radio frequency trap circuit, a radio frequency choke coil, a radio frequency coaxial cable, and a decoupling circuit;

wherein, the passive detuning circuit, the tuning circuit, the active detuning circuit and the matching circuit are arranged in the copper circuit of the coil units; and the radio frequency trap circuit is connected to the active detuning circuit, the radio frequency choke coil is connected to the radio frequency trap circuit in series, one end of the radio frequency coaxial cable is connected to the matching circuit, and the other end is connected to the decoupling circuit, and the decoupling circuit is connected to preamplifiers in the coil units.

8. The flexible radio frequency receiving coil array of claim 7, wherein the passive detuning circuit comprises a first capacitor, a first inductor, a first diode, and a second diode, the first capacitor is arranged in the copper circuit of the coil units, and the first diode and the second diode are connected in parallel with opposite polarities, the first inductor is connected to the first diode and the second diode in series, and the first capacitor is connected to the first inductor, the first diode and the second diode in parallel;

the tuning circuit comprises a second capacitor and a first variable capacitor, the second capacitor is arranged in the copper circuit of the coil units, and the second capacitor is connected to the first variable capacitor in parallel;

the active detuning circuit comprises: a third capacitor, a second inductor, and a third diode; the third capacitor is arranged in the copper circuit of the coil units, and the second inductor is connected to the third diode in series, the third capacitor is connected to the second inductor and the third diode in parallel;

the matching circuit comprises a fourth capacitor and a second variable capacitor, the fourth capacitor is arranged in the copper circuit of the coil units, and the fourth capacitor is connected to the second variable capacitor in parallel;

the radio frequency trap circuit comprises a fifth capacitor and a third inductor, and the fifth capacitor is connected to the third inductor in parallel; and the decoupling circuit comprises a sixth capacitor and a third variable capacitor, and the sixth capacitor is connected to the third variable capacitor in parallel.

9. The flexible radio frequency receiving coil array of claim 2, wherein the flexible panel comprises a flexible circuit board and a flexible installation board, the copper circuit of the coil units is printed on the flexible circuit board, and the preamplifiers installation plate is arranged on the flexible installation board.

10. The flexible radio frequency receiving coil array of claim 9, wherein a plurality of through holes are arranged on the flexible panel, and the through holes are rectangular or circular.

11. The flexible radio frequency receiving coil array of claim 9, wherein the flexible circuit board is made of a polyimide film or a polyester film, and the flexible installation board is made of a polyethylene foam.

12. The flexible radio frequency receiving coil array of claim 1, wherein the flexible panel comprises a flexible circuit board and a flexible installation board, a copper circuit of the coil units is printed on the flexible circuit board, and the preamplifiers installation plate is arranged on the flexible installation board.

13. The flexible radio frequency receiving coil array of claim 12, wherein a plurality of through holes are arranged on the flexible panel, and the through holes are rectangular or circular.

14. The flexible radio frequency receiving coil array of claim 12, wherein the flexible circuit board is made of a polyimide film or a polyester film, and the flexible installation board is made of a polyethylene foam.

15. The flexible radio frequency receiving coil array of claim 1, wherein the flexible panel comprises a flexible circuit board and a flexible installation board, a copper circuit of the coil units is printed on the flexible circuit board, and the preamplifiers installation plate is arranged on the flexible installation board.

16. The flexible radio frequency receiving coil array of claim 15, wherein a plurality of through holes are arranged on the flexible panel, and the through holes are rectangular or circular.

17. The flexible radio frequency receiving coil array of claim 15, wherein the flexible circuit board is made of a polyimide film or a polyester film, and the flexible installation board is made of a polyethylene foam.

* * * * *